United States Patent [19]

Maegawa et al.

[11] Patent Number: 5,591,668
[45] Date of Patent: Jan. 7, 1997

[54] LASER ANNEALING METHOD FOR A SEMICONDUCTOR THIN FILM

[75] Inventors: Shigeki Maegawa, Moriguchi; Tetsuya Kawamura; Mamoru Furuta, both of Hirakata; Yutaka Miyata, Ikoma, all of Japan

[73] Assignee: Matsushita Electric Industrial Co., Ltd., Osaka, Japan

[21] Appl. No.: 402,476

[22] Filed: Mar. 13, 1995

[30] Foreign Application Priority Data

Mar. 14, 1994 [JP] Japan ................... 6-042592

[51] Int. Cl.$^6$ ................................ H01L 21/268
[52] U.S. Cl. ................. 437/174; 437/907; 437/967; 117/8; 117/10; 117/904; 117/44; 148/DIG. 90; 148/DIG. 93; 148/DIG. 122
[58] Field of Search ................... 437/19, 21, 46, 437/109, 173, 174, 233, 906, 907, 973, 967, 40 TFT, 41 TFT; 117/8, 10, 43, 44, 904; 148/DIG. 90, DIG. 91, DIG. 92, DIG. 93, DIG. 122, DIG. 1; 219/121.73, 121.74, 121.75, 121.76, 121.78, 121.79, 121.8, 121.85

[56] References Cited

U.S. PATENT DOCUMENTS

| | | | |
|---|---|---|---|
| 4,234,358 | 11/1980 | Celler et al. | 437/19 |
| 4,475,027 | 10/1984 | Pressley | 219/121.73 |
| 4,497,683 | 2/1985 | Celler et al. | 437/99 |
| 4,545,823 | 10/1985 | Drowley | 117/44 |
| 4,589,951 | 5/1986 | Kawamura | 117/904 |
| 5,264,383 | 11/1993 | Young | 437/40 TFT |
| 5,365,875 | 11/1994 | Asai et al. | 117/7 |

FOREIGN PATENT DOCUMENTS

| | | |
|---|---|---|
| 55-153327 | 11/1980 | Japan . |
| 59-25215 | 2/1984 | Japan ................... 437/173 |
| 1-76715 | 3/1989 | Japan . |
| 1-239837 | 9/1989 | Japan ................... 437/174 |
| 3-286518 | 12/1991 | Japan . |
| 4-130623 | 5/1992 | Japan ................... 437/173 |
| 5-74702 | 3/1993 | Japan ................... 437/173 |
| 6-252048 | 9/1994 | Japan . |

OTHER PUBLICATIONS

P. Zorabedian, et al., J. Appl. Phys., 57(12)(1985) 5262 "Laser Scan registration For lateral Epitaxy of SOI Stripes ...".

T. J. Stutz, et al., Appl. Phys. Lett. 39(1981) 498 "... Beam Shaping to Achieve Large-grain CW laser ... Polysilicon ...".

Primary Examiner—Charles L. Bowers, Jr.
Assistant Examiner—Leon Radomsky
Attorney, Agent, or Firm—Ratner & Prestia

[57] ABSTRACT

A laser annealing method for a semiconductor thin film for irradiating the semiconductor thin film with a laser beam having a section whose outline includes a straight-line portion, so as to change the crystallinity of the semiconductor thin film is provided, wherein the semiconductor thin film is overlap-irradiated with the laser beam while the laser beam is shifted in a direction different from a direction along the straight-line portion. A thin film semiconductor device fabricated by use of the laser annealing method is also provided.

13 Claims, 4 Drawing Sheets

Section of laser beam

Laser annealing method

Laser beam shift direction

LASER ANNEALING METHOD FOR A SEMICONDUCTOR THIN FILM

BACKGROUND OF THE INVENTION

1. Field of the Invention

The present invention relates to a laser annealing method for a semiconductor thin film and a thin film semiconductor device. More specifically, the present invention relates to a laser annealing method for a semiconductor thin film used in a process of fabricating thin film transistors (TFTs) for liquid crystal displays (LCDs), image sensors, SRAMs, and the like, and a thin film semiconductor device fabricated by use of the laser annealing method.

2. Description of the Related Art

In recent years, TFTs have been actively applied to LCDs, image sensors, SRAMs, and the like. In many cases, a number of TFTs are integrated on one substrate. In order to improve the packing density of integrated TFTs, the size of the TFTs should be reduced. For the application of TFTs to an LCD, in particular, it is desirable that a driving circuit for a liquid crystal display panel of the LCD is formed of TFTs arranged on a glass substrate of the panel. Such TFTs for a driving circuit are required to operate at a higher speed than that for TFTs for switching arranged in the display portion. In order to obtain TFTs operating at high speed, a semiconductor thin film having a higher carrier mobility (field effect mobility) is required.

There is known a technique for increasing the carrier mobility of a polysilicon TFT by annealing a semiconductor thin film at a high temperature of 600° C. or more, for example. High-temperature annealing, however, may thermally damage a substrate. Accordingly, such high-temperature annealing is not possible when an inexpensive glass substrate having a low distortion point is used. Non-alkaline borosilicate glass having a distortion point of 650° C. or less (for example, Corning No. 7059) is less expensive than silica glass. For this reason, a technique for forming a semiconductor thin film having a high carrier mobility on such a glass substrate is strongly desired.

A laser annealing method using an excimer laser makes it possible to crystallize amorphous silicon (Si) while the temperature of a substrate is kept as low as about 600° C. or less, so as to form a polysilicon layer having a large grain size. Since thermal damage received by the substrate is small, this laser annealing method is a promising method.

Hereinbelow, a conventional annealing method for obtaining a polysilicon thin film having a large grain size from a non-singlecrystalline Si thin film will be described. In this method, overlap irradiation of the non-singlecrystalline Si thin film with an excimer laser beam is performed. The "overlap irradiation" as used herein refers to a type of irradiation where a region of the non-singlecrystalline Si thin film melted/solidified by the Nth pulse irradiation partially overlaps a region thereof melted/solidified by the (N+1)th pulse irradiation (N is a natural number).

FIG. 3 schematically shows a laser annealing method for a semiconductor thin film adopting the overlap irradiation. Referring to FIG. 3, the reference numerals 3a to 3d denote regions of a non-singlecrystalline Si thin film 4 on a substrate 5, of which crystallinity has changed due to the irradiation with a laser beam 1.

As shown in FIG. 3, the non-singlecrystalline Si thin film 4 on the substrate 5 is irradiated with the laser beam 1 by pulsing. In general, the pulse duration is in the range of 20 to 60 nanoseconds, and the pulse interval is in the range of 3 to 30 milliseconds.

The non-singlecrystalline Si in the region irradiated with the laser beam 1 is first melted and then solidified, thereby changing the crystallinity. More specifically, the silicon shifts from the non-singlecrystalline state to a crystalline state. The "crystalline state" as used herein refers to the state where a plurality of grains each recognized as singlecrystal are formed (generally, called a polycrystalline state). In the crystalline state, the carrier mobility is high when the number of crystal defects is small and when grains are large and thus the area of grain boundaries is small, thereby exhibiting good crystallinity.

By the irradiation with the laser beam 1, the region 3a having a crystallinity different from the surrounding regions is formed in the Si thin film. Then, the relative positioning between the substrate 5 and the laser beam 1 is changed so that the next region to be irradiated with the laser beam 1 partially overlaps the region 3a previously irradiated with the laser beam 1. The relative positioning may be changed by shifting the position of the laser beam 1 or the substrate 5.

Thereafter, the Si thin film is again irradiated with the laser beam 1, so as to form the region 3b having a crystallinity different from the surrounding regions in the Si thin film 4. The same procedure is repeated so as to sequentially form the regions 3c and 3d each having a crystallinity different from the surrounding regions.

Thus, a series of pulses of irradiation are performed by shifting the position of the laser beam 1 with regard to the substrate 5 in a first direction as shown in FIG. 3. Then, the position of the laser beam 1 is shifted in a second direction perpendicular to the first direction. This shift is performed so that the next irradiation region partially overlaps the previously irradiated region. Thereafter, a series of pulses of irradiation is repeated by shifting the position of the laser beam 1 in a direction opposite to the first direction. Alternatively, the position of the laser beam 1 may be returned to a position which is located below the position where the first series of pulses of irradiation started, and then a series of pulses of irradiation may be repeated by shifting the position of the laser beam 1 in the first direction. By repeating such irradiation, the entire surface of the substrate 5 is finally covered with regions irradiated with the laser beam 1.

In general, the irradiation intensity required for the laser annealing of an Si thin film with an excimer laser beam is in the order of several hundreds mJ/cm$^2$.

FIG. 4A illustrates a section of a conventionally used laser beam and the intensity distribution thereof. FIG. 4B illustrates a conventional overlap irradiation method (beam scanning method).

Referring to FIG. 4A, the reference numerals 1a and 1b denote a flat portion and an edge portion of the laser beam 1, respectively. Referring to FIG. 4B, the reference numerals 2a and 2b denote a region irradiated with the edge portion 1b of the laser beam 1, and a region overlap-irradiated with the edge portion 1b for four consecutive times, respectively. The reference numeral 3 denotes a region of which crystallinity has changed by the irradiation with the laser beam 1.

Original laser light emitted from a laser light source such as an excimer laser has a substantially oval section (minor axis: 10–20 mm, major axis: 30–50 mm). The intensity of laser light emitted from the laser light source exhibits a proximate Gaussian distribution across the section thereof. Such laser light is optically split into a plurality of beam elements, and the split beam elements are re-synthesized so as to overlap one another. Thus, the laser beam 1 as shown in FIG. 4A (beam shaping) is obtained. As shown in FIG. 4A, the section of the laser beam 1 is substantially square (from about 5 mm×about 5 mm to about 10 mm×about 10 mm). The intensity across the section of the laser beam 1 exhibits substantially trapezoidal distribution including a flat region (the flat portion 1a). Even though a plurality of beam elements are re-synthesized so as to overlap one another, a region having a completely uniform intensity is not obtainable. It is possible, however, to form the laser beam 1 having a region (with a size of 8 mm×8 mm, for example) where the variation in the intensity is within the order of ±10%. The width of the edge portion 1a of the laser beam 1 is generally in the range of 1–2 mm.

As shown in FIG. 4B, the conventional "overlap irradiation" is performed by shifting the laser beam 1 in a direction parallel to a straight-line portion of the outline of the section of the laser beam 1. In the case shown in FIG. 4B, when the size of the section of the laser beam 1 is L mm×L mm, the position of the laser beam 1 shifts by L/4 mm during the interval between the Nth irradiation and the (N+1)th irradiation. This case is expressed herein as "the overlap ratio is three-fourths (75%)". In this conventional case shown in FIG. 4B, the region 2b included in the region irradiated with the edge portion 1b of the laser beam 1, which extends along the shift direction of the laser beam 1 is irradiated with the edge portion 1b of the laser beam 1 for four times. This number of irradiation times depends on the "overlap ratio".

On the other hand, the region 2a extending perpendicular to the shift direction of the laser beam 1 is irradiated with the edge portion 1b of the laser beam 1 only once during the scanning shown in FIG. 4B. After the initial irradiation with the edge portion 1b, the region 2a is irradiated with the flat portion 1a of the laser beam 1 for three times.

As described above, the region 2b is irradiated with the edge portion 1b of the laser beam 1 for four consecutive times. This region 2b extends to form strips on the top surface of the substrate 5.

The inventors of the present invention have found that the above conventional method has problems as follows:

(1) The region initially irradiated with the edge portion 1b of the laser beam 1 is lower in the crystallinity than the region initially irradiated with the flat portion 1a of the laser beam 1.

(2) The region 2b initially irradiated with the edge portion 1b of the laser beam 1 and then also irradiated with the edge portion 1b is lower in the crystallinity than the region initially irradiated with the edge portion 1b of the laser beam 1 and then irradiated with the flat portion 1a thereof.

(3) The region initially irradiated with the edge portion 1b of the laser beam 1 for K consecutive times is lower in the crystallinity than the region initially irradiated with the edge portion 1b for (K–1) consecutive times.

(4) The difference in the crystallinity described above in (2) and (3) remains even though the former region is subsequently irradiated with the flat portion 1a of the laser beam 1.

(5) Once the crystallinity of the region 2b subjected to the overlap irradiation with the edge portion 1b of the laser beam i differs from those of other regions, this causes a variation in the device performance depending on the difference in the crystallinity.

SUMMARY OF THE INVENTION

The laser annealing method for a semiconductor thin film of this invention includes irradiating the semiconductor thin film with a laser beam having a section whose outline includes a straight-line portion, so as to change the crystallinity of the semiconductor thin film, wherein the semiconductor thin film is overlap-irradiated with the laser beam while the laser beam is shifted in a direction different from a direction along the straight-line portion.

In one embodiment, the section of the laser beam is a square or a rectangle, and the straight-line portion forms one side of the square or the rectangle.

In another embodiment, the semiconductor thin film is irradiated with the laser beam while the laser beam is shifted in a direction inclined by 45°±30° with regard to the straight-line portion included in the outline of the section of the laser beam.

In still another embodiment, the laser beam is obtained by optically splitting laser light emitted from a laser light source into a plurality of beam elements and re-synthesizing the plurality of split beam elements.

In still another embodiment, the intensity of the laser beam exhibits a substantially trapezoidal distribution across the section of the laser beam.

In still another embodiment, the straight-line portion included in the outline of the section of the laser beam has a length of 5 mm or more.

In still another embodiment, the semiconductor thin film is a non-singlecrystalline silicon thin film.

In still another embodiment, the laser beam is a beam from an excimer laser.

Alternatively, a laser annealing method for a semiconductor thin film for irradiating the semiconductor thin film with a laser beam, so as to change the crystallinity of the semiconductor thin film is provided. The method includes the steps of: shaping the laser beam so that the section of the laser beam is a closed curve without a straight-line portion by optically splitting laser light emitted from a laser light source into a plurality of beam elements and re-synthesizing the plurality of split beam elements; and overlap-irradiating the semiconductor thin film with the laser beam while the laser beam is shifted.

In one embodiment, the section of the laser beam is an oval or a circle.

In another embodiment, the intensity of the laser beam exhibits a substantially trapezoidal distribution across the section of the laser beam.

In still another embodiment, the semiconductor thin film is a non-singlecrystalline silicon thin film.

In still another embodiment, the laser beam is a beam of an excimer laser.

Alternatively, a laser annealing method for a semiconductor thin film, for irradiating the semiconductor thin film with a laser beam in a pulse-like manner, so as to change the crystallinity of the semiconductor thin film is provided, wherein, in the case where a region of the semiconductor thin film having a size corresponding to a section of the laser beam is irradiated with the laser beam for four or more consecutive times while the laser beam is shifted in a predetermined direction, a region of the semiconductor thin film which is initially irradiated with a peripheral portion of the laser beam having a relatively weak beam intensity is subsequently irradiated with the peripheral portion of the laser beam for three or less consecutive times.

In one embodiment, the intensity distribution of the laser beam is substantially flat in the central portion of the laser beam, and sharply changes in the peripheral portion of the laser beam.

In another embodiment, the beam intensity of the peripheral portion of the laser beam is not sufficiently strong for the semiconductor thin film to be completely melted.

In still another embodiment, the width of the peripheral portion of the laser beam is 2 mm or less.

In still another embodiment, the laser beam has a section whose outline includes a straight-line portion.

In still another embodiment, the laser beam is obtained by optically splitting laser light emitted from a laser light source into a plurality of beam elements and re-synthesizing the plurality of split beam elements, and the laser is shaped so that the section of the laser beam is a closed curve without a straight-line portion.

In another aspect of the present invention, a thin film semiconductor device is provided. The device includes an active element formed on at least a portion of a semiconductor thin film, the semiconductor thin film being overlap-irradiated with a laser beam having a section whose outline includes a straight-line portion, while the laser beam is shifted in a direction different from the direction along the straight-line portion, so as to change the crystallinity of the semiconductor thin film.

Alternatively, a thin film semiconductor device is provided. The device includes an active element formed on at least a portion of a semiconductor thin film, the semiconductor thin film being formed by being overlap-irradiated with a laser beam while the laser beam is shifted, the laser beam being shaped so that the section of the laser beam is a closed curve without a straight-line portion by optically splitting laser light emitted from a laser light source into a plurality of beam elements and re-synthesizing the plurality of split beam elements.

According to the present invention, a region of a semiconductor thin film initially irradiated with the edge portion of the laser beam will not be irradiated with the edge portion for additional four or more consecutive times even when the overlap ratio is three-quarters (75%). Accordingly, the number of consecutive times when a specific region of the semiconductor thin film is irradiated with the peripheral portion of the laser beam is reduced, compared with the case of the conventional method.

Since an edge portion of a laser beam is weak in energy intensity, a region of a non-singlecrystalline thin film initially irradiated with the edge portion of the laser beam is not supplied with an energy intensity strong enough for the region to be completely melted/solidified. Accordingly, the region remains in the non-singlecrystalline state in the inner deep portion thereof, though it is melted/solidified in the surface portion. Even when such a region is irradiated with the central portion of the laser beam having an energy intensity strong enough for the melting/solidification immediately after the irradiation with the low-energy laser beam, the region will not be uniformly melted/solidified any more from the top through the bottom of the semiconductor thin film since the surface portion thereof is not melted/solidified. This results in a two-layer structure of crystallinity. Accordingly, the region initially irradiated with the edge portion of the laser beam is finally left more degraded in crystallinity than the region initially irradiated with the central portion of the laser beam. A region initially irradiated with the edge portion of the laser beam for a plurality of consecutive times is insufficiently melted/solidified for every irradiation. Therefore, it is considered that a structure composed of a plurality of layers different in their crystallinity is formed in the semiconductor thin film. Such a multi-layer structure remains even though the region is subsequently irradiated with the central portion of the laser beam, and as the number of layers increase, the crystallinity lowers.

A region of the non-singlecrystalline semiconductor thin film initially irradiated with the central portion of the laser beam is sufficiently melted/solidified by this irradiation. The good crystallinity of this region remains even though the region is subsequently irradiated with the edge portion of the laser beam.

According to the present invention, the number of consecutive times when a specific region of the semiconductor thin film is irradiated with the edge portion of the laser beam can be reduced, and the area of the region subjected to such consecutive irradiation with the low-energy laser beam can be reduced. This improves the uniformity of the crystallinity of the laser-annealed semiconductor thin film over the surface of the substrate. As a result, when a plurality of thin film semiconductor devices are to be fabricated on the thus obtained semiconductor thin film, the uniformity of performance of the plurality of devices over the surface of the substrate can be improved. Also, the ratio of the area of the region overlap-irradiated with the edge portion of the laser beam to the total area of the substrate can be reduced.

Thus, the invention described herein makes possible the advantages of (1) providing a laser annealing method for a semiconductor thin film capable of reducing the difference in crystallinity between a region of the thin film irradiated with an edge portion of a laser beam and other irradiated regions thereof is reduced so as to obtain a uniform device performance over the surface of the substrate, and (2) providing a thin film semiconductor device fabricated by such a laser annealing method.

These and other advantages of the present invention will become apparent to those skilled in the art upon reading and understanding the following detailed description with reference to the accompanying figures.

DESCRIPTION OF THE PREFERRED EMBODIMENTS

The present invention will be described taking, as an example, the case where non-singlecrystalline Si is annealed by overlap irradiation with an excimer laser beam.

(EXAMPLE 1)

Figure 1A:
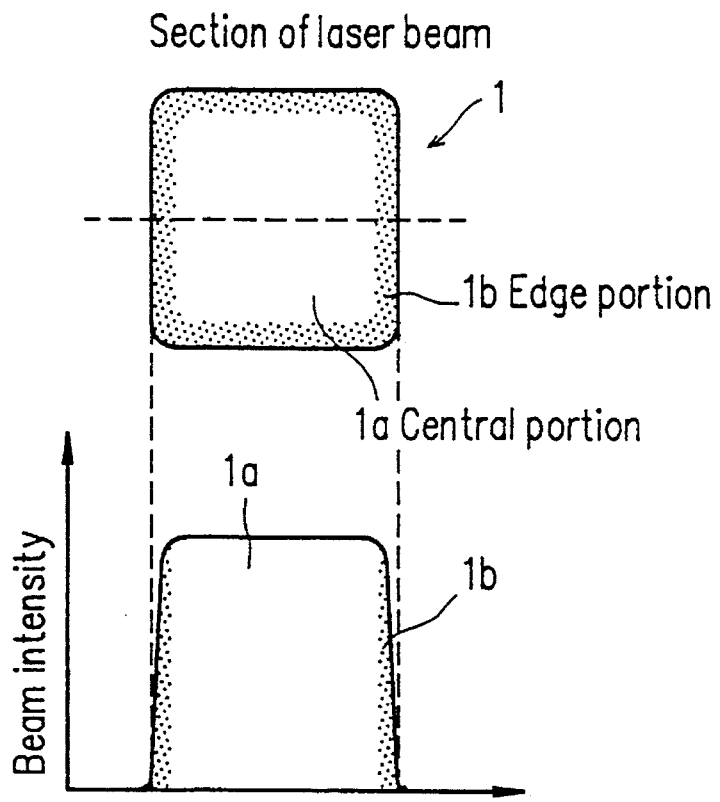
FIG. 1A is a schematic view illustrating the shape of a laser beam used in a first example according to the present invention.
Figure 1B:
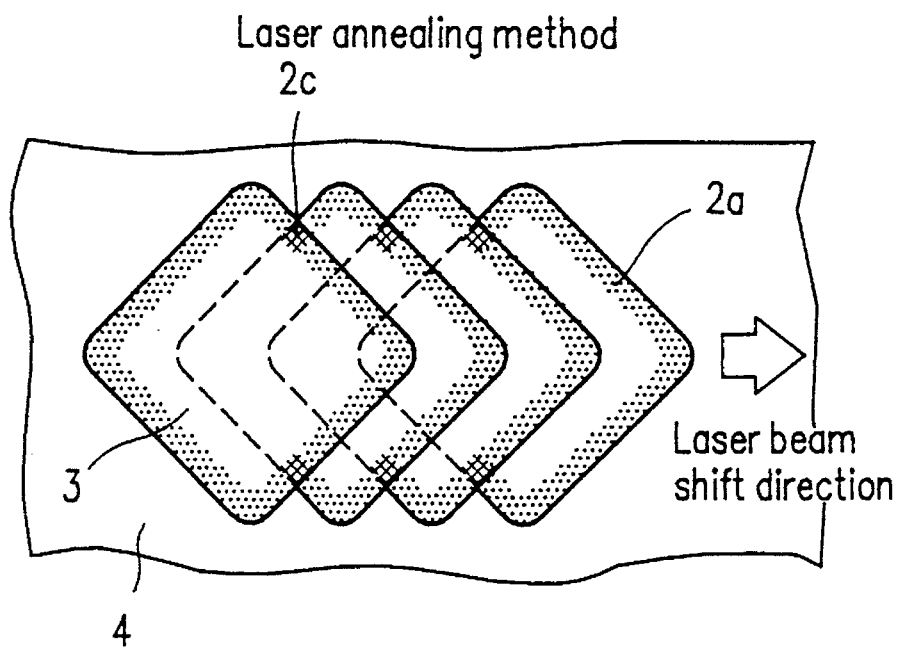
FIG. 1B is a plan view illustrating a laser annealing method for a semiconductor thin film by overlap irradiation of the first example.

FIG. 1A illustrates a section of a laser beam used in this example and the intensity distribution thereof. FIG. 1B illustrates an overlap irradiation method (beam scanning method) of this example.

Referring to FIG. 1A, the reference numerals 1a and 1b denote a flat portion and an edge portion of the laser beam 1, respectively. Referring to FIG. 1B, the reference numerals 2a and 2c denote a region irradiated with the edge portion 1b of the laser beam 1, and a region overlap-irradiated with the edge portion 1b for two consecutive times, respectively. The reference numeral 3 denotes a region of an Si thin film of which crystallinity has changed by the irradiation with the laser beam 1.

In this example, as in the conventional case, a laser beam shaped to have a substantially square section is used as the laser beam 1. The shift direction of the laser beam 1 is different from that in the conventional case. That is, as shown in FIG. 1B, the laser beam 1 is shifted in a direction not along the straight-line portion of the outline of the section of the laser beam 1.

In this example, overlap irradiation with an overlap ratio of 75% is performed. A portion of the region 2a initially irradiated with the edge portion 1b of the laser beam 1 and subsequently irradiated with the edge portion 1b is denoted by the reference numeral 2c. Portions other than the portion 2c of the region 2a are subsequently irradiated with the flat portion 1a of the laser beam 1 during the overlap irradiation shown in FIG. 1B.

Figure 4A:
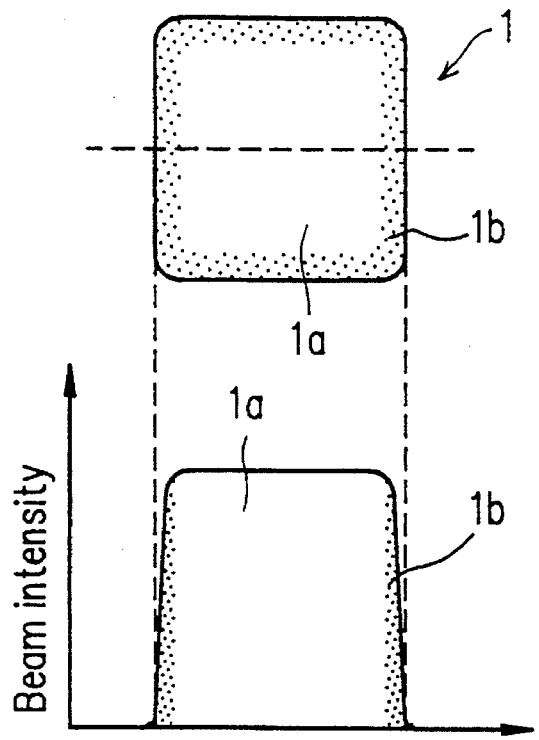
FIG. 4A is a schematic view illustrating the shape of a conventionally used laser beam.
Figure 4B:
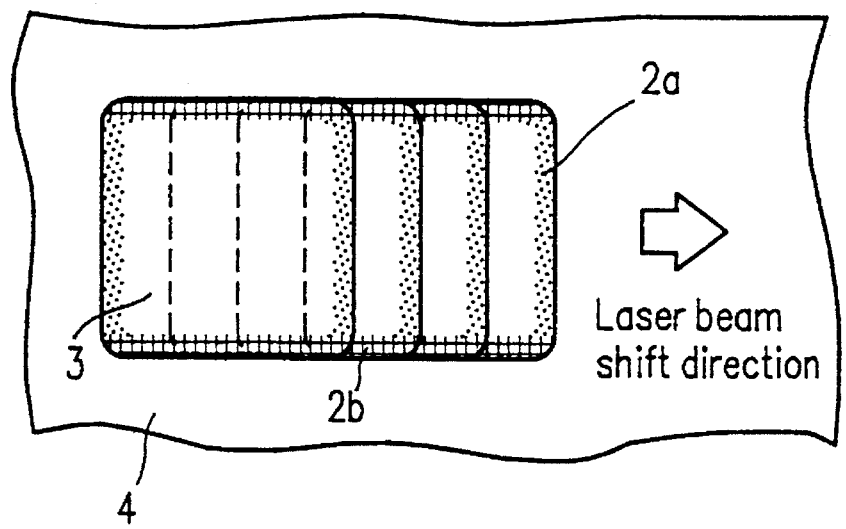
FIG. 4B is a plan view illustrating a conventional laser annealing method for a semiconductor thin film using overlap irradiation.

With the above overlap irradiation as shown in FIG. 1B, any region of the Si thin film is irradiated with the edge portion 1b of the laser beam 1 for a smaller number of times than in the conventional case. As described hereinbefore, when a region is initially irradiated with the peripheral portion 1b of the laser beam 1, the crystallinity of the region is no more improved even when the region is subsequently irradiated with the flat portion 1a of the laser beam 1. Also, a region initially irradiated with the edge portion 1b of the laser beam 1 for K consecutive times remains more degraded in crystallinity than a region initially irradiated with the edge portion 1b for (K-1) consecutive times. Accordingly, in FIG. 1B, the region 2c is more degraded in crystallinity than the other regions of the Si thin film. However, the crystallinity of the region 2c is better than that of the region 2b shown in FIG. 4B, and the area of the region 2c is significantly smaller than that of the region 2b. As a result, when TFTs were fabricated using the Si thin film obtained by the laser annealing method of the present invention, the variation in the device performance of the resultant TFTs over the surface of the substrate 5 was reduced, compared with that of TFTs fabricated by the conventional laser annealing method.

In this example, the laser beam 1 was shifted in a direction inclined by 45° with regard to the straight-line portion of the outline of the section of the laser beam 1. However, a similar effect can also be obtained by shifting the laser beam 1 in a direction inclined by 45±30°.

(EXAMPLE 2)

Another example of the laser annealing method according to the present invention will be described with reference to FIGS. 2A and 2B.

Figure 2A:
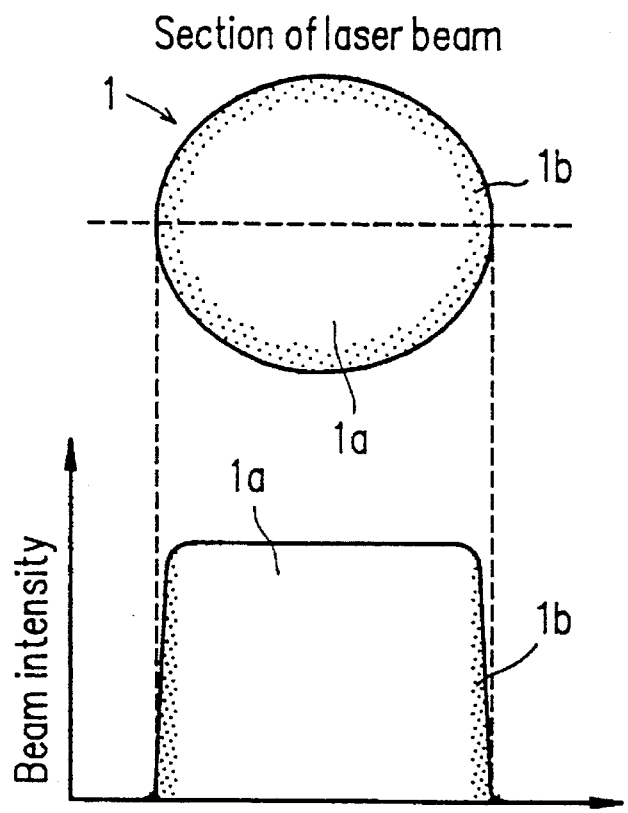
FIG. 2A is a schematic view illustrating the shape of a laser beam used in a second example according to the present invention.
Figure 2B:
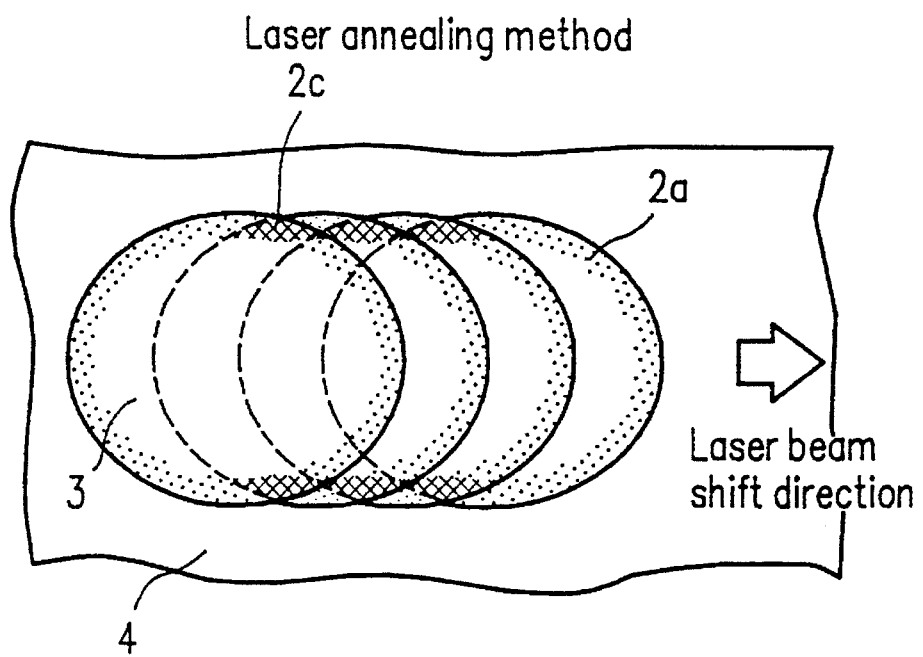
FIG. 2B is a plan view illustrating a laser annealing method for a semiconductor thin film by use of overlap irradiation of the second example.
Figure 3:
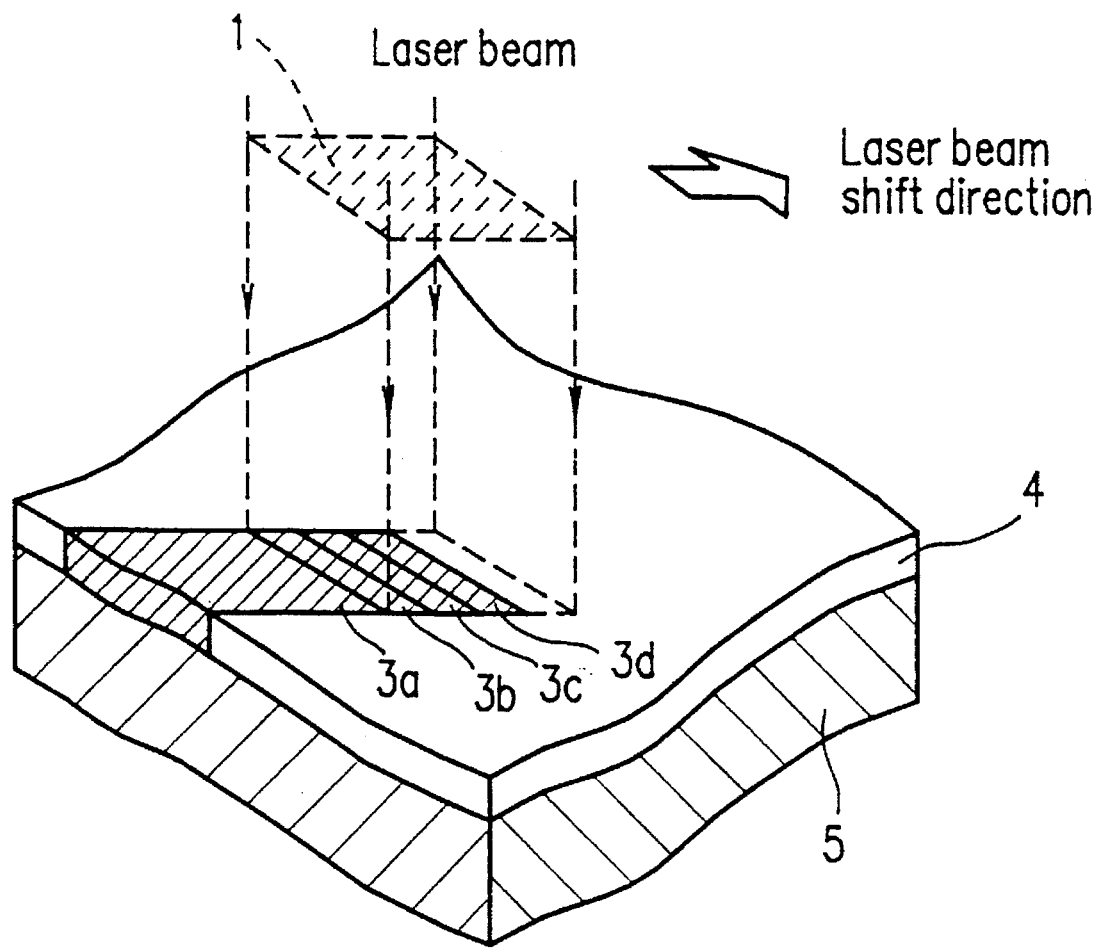
FIG. 3 is a schematic view illustrating a conventional laser annealing method for a semiconductor device using overlap irradiation.

FIG. 2A illustrates a section of a laser beam used in this example and the intensity distribution thereof. FIG. 2B illustrates an overlap irradiation method (beam scanning method) of this example.

Referring to FIG. 2A, the reference numerals 1a and 1b denote a flat portion and an edge portion of the laser beam 1, respectively. Referring to FIG. 2B, the reference numerals 2a and 2c denote a region irradiated with the edge portion 1b of the laser beam 1, and a region overlap-irradiated with the edge portion 1b for two consecutive times, respectively. The reference numeral 3 denotes a region of an Si thin film of which crystallinity has changed by the irradiation with the laser beam 1.

The section of the laser beam 1 used in this example is oval, having no straight-line portion in the outline of the oval section. The original laser light emitted from an excimer laser has also a substantially oval section. However, the laser beam 1 of this example is greatly different in the intensity distribution from the original laser light. More specifically, the intensity across the section of the laser beam 1 exhibits a substantially trapezoidal distribution including a flat region (the flat portion 1a), not the Gaussian distribution. The laser beam 1 with this intensity distribution is obtained by first splitting laser light emitted from an excimer laser light source and then re-synthesizing split beam elements so as to partially overlap one another. A plurality of split beam elements are arranged into an oval shape, so as to obtain the laser beam 1 as shown in FIG. 2A. The oval section of the laser beam 1 is about 6 mm in the minor axis and about 10 mm in the major axis. The size of the laser beam 1 can be made larger as the output of the laser used is larger.

In this example, the overlap irradiation is performed by moving the laser beam 1 having the intensity distribution shown in FIG. 2A in a predetermined direction (not restrictive). As is apparent from FIG. 2B, there is no region of the Si thin film which is overlap-irradiated with the edge portion 1b of the laser beam 1 linearly for four consecutive times. Though the portion 2c is initially irradiated with the edge portion 1b and then irradiated again with the edge portion 1b, the other regions of the Si thin film are not irradiated with the edge portion 1b repeatedly. As a result, a similar effect to that described in Example 1 can be obtained.

The shape of the laser beam 1 is not limited to the oval shape, but a similar effect can be obtained by other shapes having no straight-line portion in the outline of the section thereof, for example, a shape having a concave portion externally.

In above Examples 1 and 2, the beam from an excimer laser was used as the laser beam 1. However, the present invention is not limited to the excimer laser, but a similar effect can be obtained by using a beam from a YAG laser. Also, in the above examples, the non-singlecrystalline Si thin film was used as the semiconductor thin film, but a similar effect can be obtained by using another semiconductor thin film, for example, non-singlecrystalline Ge thin film.

As described above, according to the present invention, a laser beam shaped so that the section thereof has an outline including a straight-line portion is shifted in a direction not along the straight line of the outline. In the case where the laser beam is shaped so that the section thereof has a closed curved outline not including a straight-line portion, the laser beam can be shifted in any direction. When a semiconductor thin film on the substrate is overlap-irradiated with such a laser beam for four or more consecutive times, any region which is initially irradiated with the edge portion of the light beam will be irradiated with the edge portion for only a total of three times or less. Further, the area of the region subjected to such repeated irradiation with the edge portion can be reduced. Thus, the variation in the device performance over the surface of the substrate depending on the difference in the crystallinity can be minimized. The present invention is also effective in enhancing the device yield when semiconductor devices are fabricated using the semiconductor thin film formed by the laser annealing method of the present invention.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A laser annealing method for a semiconductor thin film, for irradiating the semiconductor thin film with a laser beam having a section whose outline consists of a plurality of straight-line portions which form sides of a square or a rectangle, so as to change the crystallinity of the semiconductor thin film, wherein the semiconductor thin film is overlap-irradiated with the laser beam while the laser beam is shifted in a direction different from all directions along the plurality of straight-line portions.

2. A method according to claim 1, wherein the semiconductor thin film is irradiated with the laser beam while the laser beam is shifted in a direction inclined by 45±30° with regard to one of the straight-line portions included in the outline of the section of the laser beam.

3. A method according to claim 1, wherein the laser beam is obtained by optically splitting laser light emitted from a laser light source into a plurality of beam elements and re-synthesizing the plurality of split beam elements.

4. A method according to claim 3, wherein the intensity of the laser beam exhibits a substantially trapezoidal distribution across the section of the laser beam.

5. A method according to claim 1, wherein the straight-line portion included in the outline of the section of the laser beam has a length of 5 mm or more.

6. A method according to claim 1, wherein the semiconductor thin film is a non-singlecrystalline silicon thin film.

7. A method according to claim 1, wherein the laser beam is a beam from an excimer laser.

8. A laser annealing method for a semiconductor thin film, for irradiating the semiconductor thin film with a pulsed laser beam, so as to change the crystallinity of the semiconductor thin film, wherein when a region of the semiconductor thin film whose area corresponds to a cross-sectional area of the laser beam is irradiated with at least four consecutive laser pulses while the laser beam is shifted in a line, a sub-region of the semiconductor thin film which is initially irradiated with a peripheral portion of the laser beam having a beam intensity that is weaker than a central portion of said laser beam is subsequently irradiated with the peripheral portion of the laser beam for three or less consecutive times, wherein the laser beam has a section whose outline consists of a plurality of straight-line portions which form the sides of a square or a rectangle, and wherein a direction of shifting in said straight line is different from all directions of the plurality of straight-line portions which form the sides of the square or the rectangle.

9. A method according to claim 8, wherein the intensity distribution of the laser beam is substantially flat in the central portion of the laser beam, and sharply changes in the peripheral portion of the laser beam.

10. A method according to claim 9, wherein the beam intensity of the peripheral portion of the laser beam is not sufficiently strong for the semiconductor thin film to be completely melted.

11. A method according to claim 10, wherein the width of the peripheral portion of the laser beam is 2 mm or less.

12. A method according to claim 8, wherein the laser beam is obtained by optically splitting laser light emitted from a laser light source into a plurality of beam elements and re-synthesizing the plurality of split beam elements.

13. A laser annealing method for a semiconductor thin film, comprising irradiating the semiconductor thin film with a pulsed laser began, wherein when said pulsed laser beam is scanned in a straight line, a region of the semiconductor thin film whose area corresponds to a total cross-sectional area of the laser beam has a first subregion which is irradiated with at least four consecutive laser pulses, while no other subregion of said first region is irradiated with a peripheral portion of the laser beam more than three consecutive times, the peripheral portion having a beam intensity that is weaker than the central portion of said laser began, wherein the laser beam has a section whose outline consists of a plurality of straight-line portions which form the sides of a square or a rectangle, and wherein a direction of said straight line is different from all directions of the plurality of straight-line portions.

* * * * *

UNITED STATES PATENT AND TRADE MARK OFFICE
CERTIFICATE OF CORRECTION

PATENT NO. : 5,591,668
DATED : January 7, 1997
INVENTOR(S) : Maegawa et al.

It is certified that error appears in the above-identified patent and that said Letters Patent is hereby corrected as shown below:

Column 10, line 2, before the word "line," insert the word --straight--.

Column 10, line 33, the word "began" should be --beam--.

Column 10, line 42, the word "began" should be --beam--.

Signed and Sealed this

Twentieth Day of May, 1997

*Attest:*

BRUCE LEHMAN

*Attesting Officer*  *Commissioner of Patents and Trademarks*